United States Patent [19]

Candy et al.

[11] 4,281,318

[45] Jul. 28, 1981

[54] DIGITAL-TO-DIGITAL CODE CONVERTER

[75] Inventors: James C. Candy; Bruce A. Wooley, both of Tinton Falls, N.J.

[73] Assignee: Bell Telephone Laboratories, Incorporated, Murray Hill, N.J.

[21] Appl. No.: 154,843

[22] Filed: May 30, 1980

[51] Int. Cl.³ ............................................. G06F 5/06
[52] U.S. Cl. ............................ 340/347 DD; 375/34; 340/347 AD
[58] Field of Search ................ 340/347 DD, 347 AD; 375/25–34; 364/574

[56] References Cited

U.S. PATENT DOCUMENTS

| | | | |
|---|---|---|---|
| 3,793,513 | 2/1974 | Kaneko | 340/347 DD X |
| 4,002,981 | 1/1977 | Eggermont | 340/347 DD |
| 4,032,914 | 6/1977 | Candy | 340/347 AD |
| 4,167,731 | 9/1979 | Eggermont | 340/347 DD |

OTHER PUBLICATIONS

Goodman "The Bell System Technical Journal", vol. 48, No. 2, Feb. 1969, pp. 321-343.
Candy "IEEE Transactions on Communications", Nov. 1976, pp. 1268-1275.

Primary Examiner—Charles D. Miller
Attorney, Agent, or Firm—Barry H. Freedman

[57] ABSTRACT

A digital-to-digital converter is arranged to provide "decimated" output samples at rate $f_0$, each of which represent a group of input samples received at a rate m times greater. Each output is generated using overlapped triangularly weighted accumulation on an interval including 2m preceding input samples. The samples near the beginning and end of each accumulation interval receive the smallest weight, and the samples at the middle of the interval receive the greatest weight. The converter is achievable in integrated circuit form using first and second serially connected accumulators, the first accumulating m input samples without weighting and the second being used to weight the samples so that the first receives m times the weight of the last sample. The output of the first accumulator is increased in scale by the factor "m" and the output of the second accumulator subtracted therefrom. The difference is delayed so that the next m samples may be accumulated. The output of the second accumulator is then combined with the delayed subtractor output to yield the desired overlapped, triangularly weighted accumulation.

7 Claims, 12 Drawing Figures

FIG. 12

DIGITAL-TO-DIGITAL CODE CONVERTER

TECHNICAL FIELD

The present invention relates to code converters generally and, in particular, to a digital-to-digital converter in which a sequence of multi-bit words sampled at a rate $mf_0$ is converted to a corresponding series of multi-bit words at a rate $f_0$ using overlapping, triangular weighted accumulation.

BACKGROUND OF THE INVENTION

For reasons of efficiency, ease of implementation and noise reduction, it has been suggested that an analog-to-digital converter include an input stage in which the analog signal is converted to a coarsely quantized digital representation at a sample rate many times greater than the Nyquist rate. Thereafter, the digital representation is "decimated" by combining groups of high rate samples into corresponding digital values which occur at the desired slower rate. This output may then be used directly, or filtered further prior to application to a utilization device. A general description of oversampled A/D encoding, and its features and advantages, is contained in an article by D. J. Goodman entitled "The Application of Delta Modulation to Analog-to-Digital PCM Encoding", *Bell System Technical Journal*, Vol. 48, February 1969, pp. 321-343.

In the decimation process described above, due care must be taken to reduce or eliminate the noise (distortion) introduced during the coarse quantization, and to avoid aliasing by which noise is introduced into the final digital signal during subsequent processing. One technique for decimation filtering is a unique weighted accumulation procedure described in U.S. Pat. No. 4,032,914 issued to J. C. Candy and Y. Ching (Candy being one of the inventors herein) on June 28, 1977. In that patent, the m coarsely quantized sample values for each desired output sample interval are combined using triangular or trapezoidal weighting. By this, it is meant that sample values near the beginning and end of the interval are given lower weight, relative to value, near the middle of the interval. Thus, in triangular weighting for $m=8$ samples $X_0, X_1 \ldots X_7$, a summation might be taken such that the output is proportional to $0X_0+1X_1+X_2+3X_3+4X_4+3X_5+2X_6+1X_7$. In trapezoidally weighted accumulation, the same eight samples might be weighted such that the output varies with $0x_0+1X_1+2X_2+3X_3+3X_4+3X_5+2X_6+1X_7$. If the coefficient values are plotted against time for the two examples given, the first would form a triangle and the second a trapezoid.

The technique just described, implemented using a serially connected pair of accumulators, is somewhat successful in reducing quantizing noise, as desired. However, aliasing effects still persist, to a degree, and the frequency response characteristic of the circuit does not meet all system requirements. Accordingly, it is the broad object of the present invention to provide an improved digital-to-digital converter or decimator having desired transfer characteristics. Specific objects include reduction in aliasing and simplification of circuit implementation, particularly using integrated circuit fabrication techniques.

SUMMARY OF THE INVENTION

In accordance with the present invention, a digital-to-digital converter (decimating filter) is arranged to receive a series of input samples at rate $mf_0$ and to generate a corresponding series of output samples at rate $f_0$, using overlapping triangular accumulation. By this it is meant that to generate an output sample for each group of m input samples the $n=2m$ samples $X_0, X_1 \ldots X_{n-2}, X_{n-1}$, are accumulated such that the first sample $X_0$ is given no weight, the second and last samples $X_1$ and $X_{n-1}$ are given least weight, the next inner samples $X_2$ and $X_{n-2}$ are given increased weight, and the middle sample $X_m$ is given the most weight. Of these n samples, m are in the next interval and m are in the previous interval. The overlapping triangular accumulation is achieved by applying the input samples to a series connected pair of accumulators, the first of which sums each group of m samples without weighting, and the second of which sums the samples in the first accumulator such that the first sample receives m times the weight of the last, and intermediate samples receive proportional weights between those extremes.

The output of the second accumulator is subtracted from a version of the output from the first accumulator which has been increased in scale by a factor of m, and the difference is delayed by one interval of m samples. The desired output is obtained by combining the output of the sECMjd accumulator with the output of the delay means. This implementation achieves the desired transfer characteristics with an arrangement that is simple and easily impleDEnted in integrated circuit form.

BRIEF DESCRIPTION OF THE DRAWINGS

The present invention will be more fully appreciated by consideration of the following detailed description when read in light of the accompanying drawing in which.

DETAILED DESCRIPTION

Figure 1:
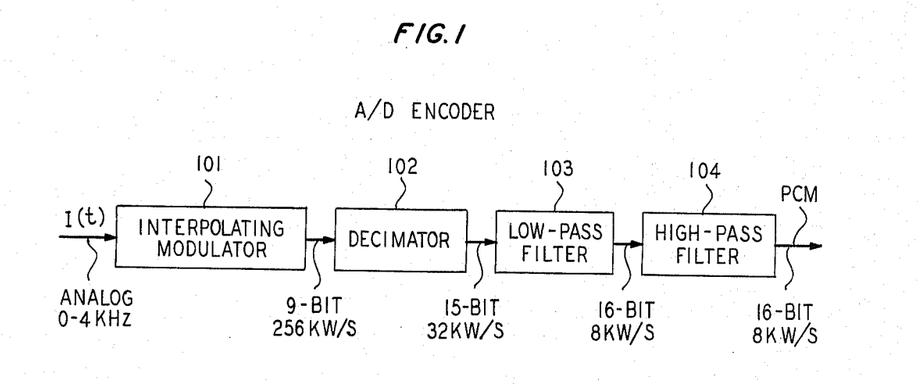
FIG. 1 is a block diagram of a prior art analog-to-digital encoder which uses a decimator or digital-to-digital code converter of the type provided by the present invention.

One primary use for the present invention is put in perspective by reference to FIG. 1, which shows an embodiment of an oversampled voiceband analog-to-digital converter in block diagram form. In this embodiment, an analog input signal I(t) having a frequency range of 0-4 KHZ is applied to an interpolating modulator 101 arranged to produce a series of 9-bit output words at a rate of $256\times10^3$ words per second (256 KW/s). The internal arrangement of modulator 101 may be identical to coder 19 of the above-cited U.S. Pat.

No. 4,032,914, wherein a stored error value (for a previous sample) is coarsely quantized, subtracted from the input, and integrated to form the error value for the next sample.

The output of interpolating modulator 101 is applied to decimator 102, which forms the subject of the present invention. The purposes of decimation in this embodiment is to provide 15-bit output words at a rate of 32 KW/s, which means that one output is provided for every eight input samples. In this case, m=8 and n=16. Decimation does not simply involve dropping 7 and using each 8$^{th}$ input word to form each output word. Instead, in accordance with the invention, and still using the frequencies of present example, each output word is formed as a weighted sum of the preceding 16 input words.

The output of decimator 102 is applied to a low pass filter 103, usually implemented as a fourth or higher order digital filter, in cascade with a digital high pass filter 104, both of which operate on 16-bit words at the Nyquist rate of 8 KW/s. By interposing decimator 102 in the A/D encoder, the operating speed and power requirements of filters 103 and 104 are advantageously reduced, enabling practical implementation using integrated circuit technology.

Figure 2:
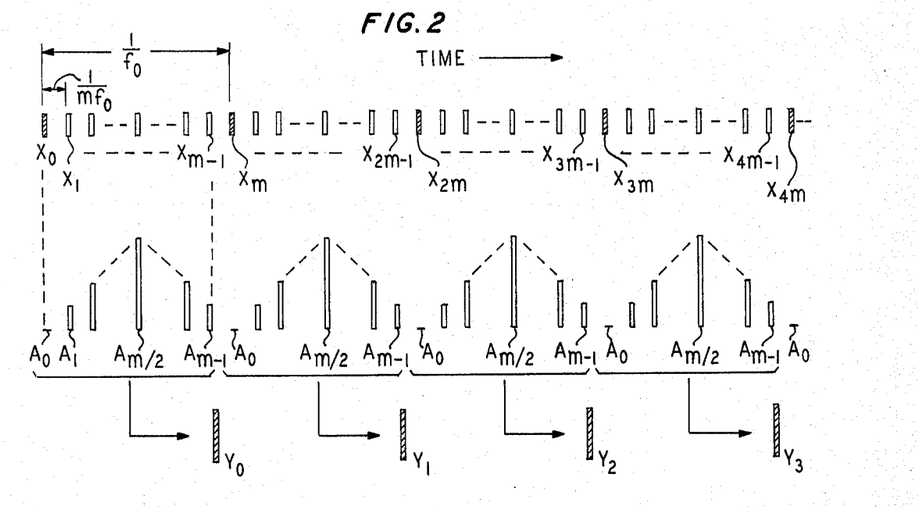
FIG. 2 is a diagram illustrating ordinary triangularly weighted accumulation heretofore used in prior art decimators.

In the prior art decimator circuit shown in FIG. 1 of the above-cited U.S. Pat. No. 4,032,914, triangularly weighted accumulation is used to obtain each output sample from the preceding m input samples, where the input frequency $mf_0$ is m times greater than the output frequency $f_0$, and m is assumed to be even. FIG. 2 shows a series of input samples $X_0, X_1, X_2, X_3 \ldots$ which occur every $1/mf_0$ second, every $m^{th}$ sample, $X_m, X_{2m}, X_{3m}, \ldots$ shown crosshatched, constituting the end of an accumulation interval of $1/f_0$ seconds. The weighting factors $A_0 - A_{m-1}$ used to weight corresponding samples $X_0 - X_{m-1}$ are shown graphically in FIG. 2 to form a triangular shape, such that factor $A_0$ is zero, the factors $A_1$ and $A_{m-1}$ for samples at the beginning and end of each interval are smallest and factor $A_{m/2}$ at the middle of each interval is the largest, and the intervening factors have proportionally tapering values. The value of output sample $Y_0$ is the weighted sum of the input samples in the interval, such that $Y_0 = \Sigma A_0 X_0 + A_1 X_1 \ldots A_{m-1} X_{m-1}$. The next output sample $Y_1$ is similarly weighted, so that $Y_1 = \Sigma A_0 X_m + A_1 X_{m+1} \ldots A_{m-1} X_{2m-1}$. Using integral values for the weighting coefficients of $A_0 = 0$, $A_1 = A_m = 1$, $A_2 = A_{m-1} = 2$, $A_3 = A_{m-2} = 3$, $\ldots A_{m/2} = m/2$, the decimator output $Y_i$ (i=0, 1, 2, 3 . . .) is expressed as:

$$Y_i = \sum_{K=1}^{K=m/2} K X_{K+m(i)} + \sum_{K=\frac{m}{2}+1}^{K=m-1} (m-K) X_{K+m(i)}. \quad (1)$$

The advantages of triangularly weighted accumulation of the type just described, as well as other details concerning its mathematical basis and implementation are discussed in a paper by J. C. Candy et al entitled "Using Triangularly Weighted Interpolation to Get 13-Bit PCM From A Sigma-Delta Modulator", *IEEE Transactions on Communcations*, November 1976, pp. 1268-1275. In the title of that paper, the term "interpolation" is used synonomously with "accumulation", it being noted that both terms are used to identify a characteristic of converters of the type being described herein.

Figure 5:
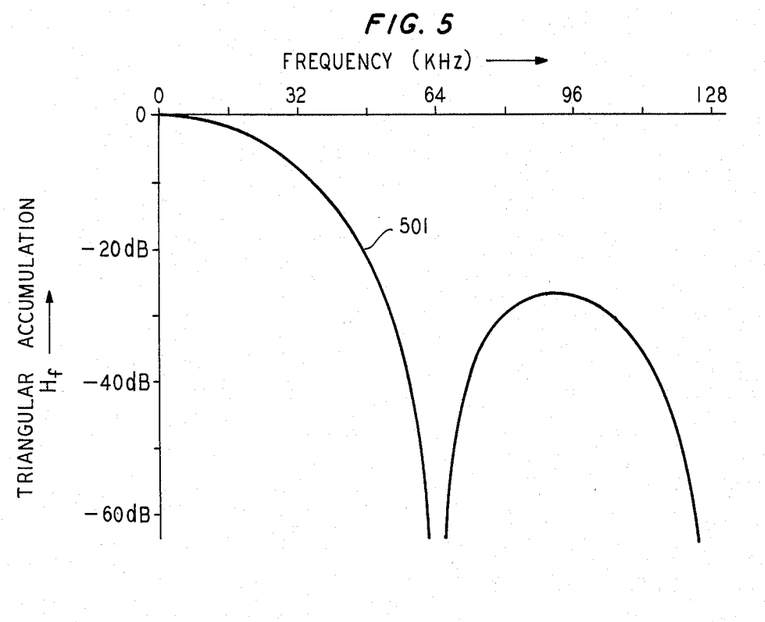
FIGS. 5 and 6 compare the transfer functions of prior art ordinary triangular accumulation (FIG. 5) and overlapped triangular accumulation (FIG. 6) in accordance with the present invention.
Figure 6:
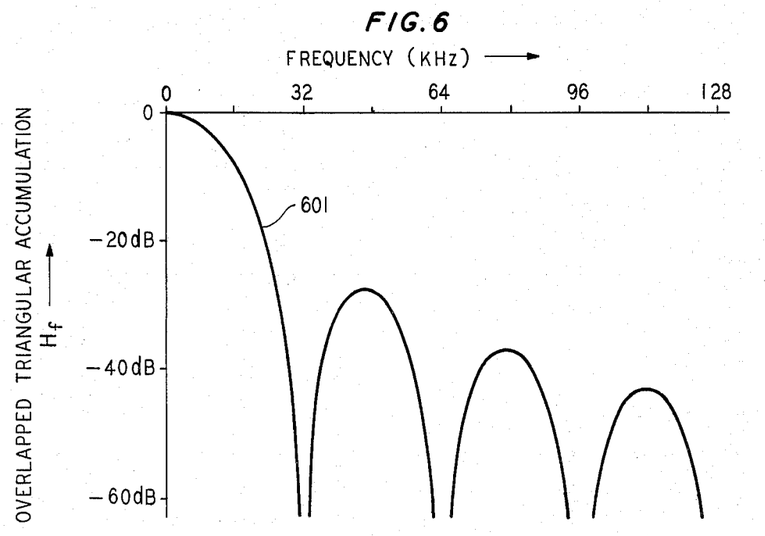

While triangularly weighted accumulation is nearly ideal for reducing the quantization noise produced by modulator 101 of FIG. 1, the aliasing problem still exists. As shown in FIG. 5, the transfer characteristic curve 501 for triangular accumulation with an input frequency of $f_1$ of 256 KW/s and an output frequency of $f_2$ of 32 KW/s is mathematically expressed as:

$$|H(f)| = |\text{sinc}(f/2f_2)/\text{sinc}(f/f_1)|^2, \quad (2)$$

and exhibits an attenuation of about 7 dB at f=32 KW/s. When the output of the decimator 102 is thereafter subsampled at 32 KW/s, in filters 103 and 104, any noise in the band around 32 KW/s is "folded" around and falls within the baseband, causing distortion. This problem is alleviated, in accordance with the present invention, by utilizing overlapped triangular accumulation, described more fully below. For this type of accumulation, the transfer characteristic curve 601 in FIG. 6 is mathematically expressed as:

$$H(f) = |\text{sinc}f/f_2/\text{sinc}f/f_1|^2, \quad (3)$$

and exhibits very high attenuation near 32 KW/s, producing little or no aliasing after subsequent subsampling.

Figure 3:
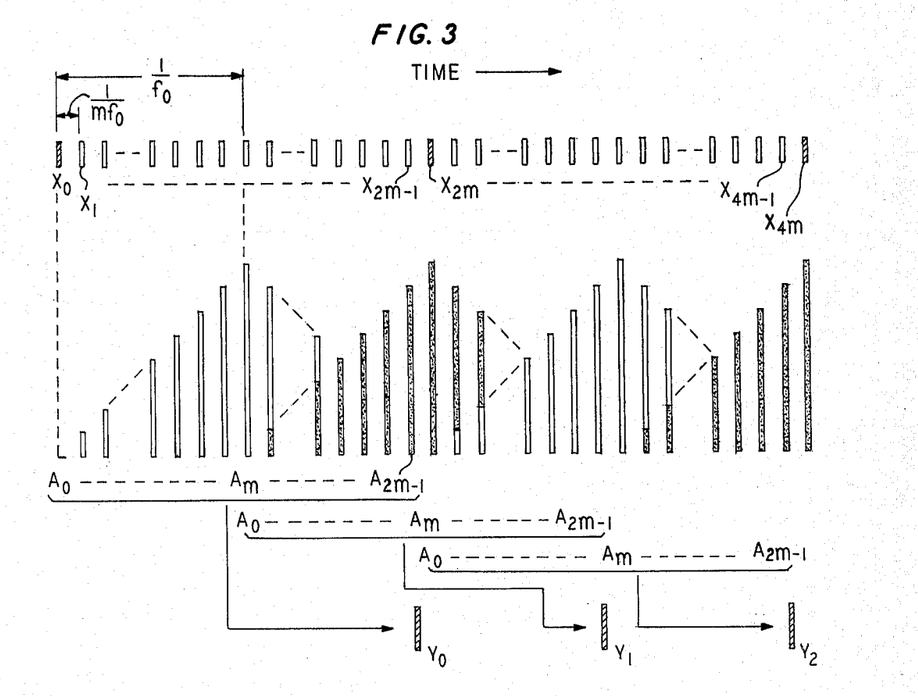
FIG. 3 illustrates overlapped triangular weighting used in accordance with the present invention.
Figure 4:
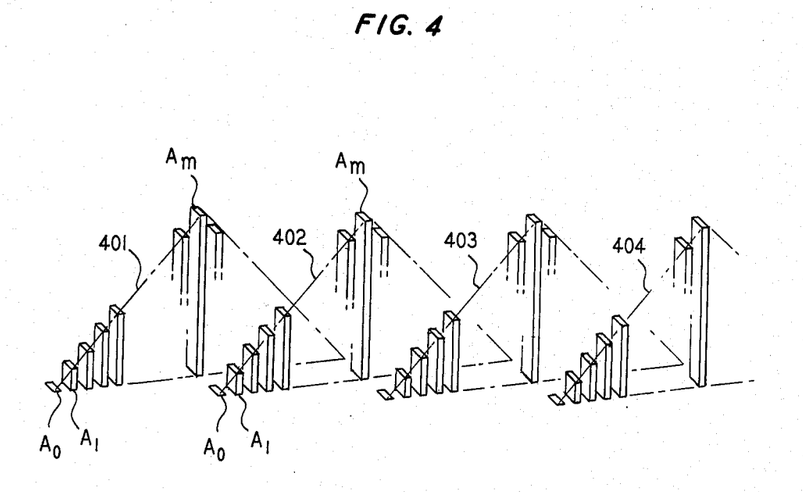
FIG. 4 is another illustration of overlapped, triangular accumulation.

FIGS. 3 and 4 graphically illustrate overlapped triangular accumulation in accordance with the present invention, using a scale enabling easy comparison with FIG. 2. The input samples $X_0, X_1, X_2 \ldots$ are the same, occurring at intervals of $1/mf_0$ seconds, and the output pulses $Y_0, Y_1, Y_2 \ldots$ occur every $1/f_0$ seconds. However, twice as many input samples are used to make up the accumulated value to which each output value is proportional, and each of the input samples contributes to two output samples. Specifically, the first output sample $Y_0$ is formed using the summation:

$$Y_0 = A_0 X_0 + A_1 X_1 + A_2 X_2 + \ldots + A_{(2m-1)} X_{(2m-1)}. \quad (4)$$

The next output same $Y_1$ is formed by summing:

$$Y_1 = A_0 X_m + A_1 X_{m+1} + A_2 X_{m+2} + \ldots + A_{(2m-1)} X_{(3m-1)}. \quad (5)$$

Thus, each output sample uses inputs from two sample intervals, and each input sample is used twice. For integral coefficient values, $A_0 - A_{n-1}$ are as follows:

$$\begin{aligned}
A_0 &= 0 \\
A_1 &= A_{n-1} = 1 \\
A_2 &= A_{n-2} = 2 \\
A_3 &= A_{n-3} = 3 \\
&\vdots \\
A_m &= m.
\end{aligned} \quad (6)$$

Again, it is to be noted that n=2m.

FIG. 4 also illustrates the overlapped, triangular shaped weighting used in accordance with the present invention. The weighting coefficients $A_0, A_1 \ldots A_m \ldots A_{2m-1}$ form a series of triangles 401 through 404 which overlap each other such that each input sample will be used as part of two accumulations to form two output samples.

The general expression for the output samples $Y_i$ (i=0, 1, 2, . . .) of a decimator using overlapped triangular accumulation with the foregoing coefficients is:

$$Y_i = \sum_{K=mi}^{m(i+1)-1} (K-mi)X_K + \sum_{K=m(i+1)}^{m(i+2)-1} [m(i+2)-K]X_K. \quad (7)$$

For an input sample rate $mf_0$ of 256 KHZ, where $m=8$, the z-transform of the decimator is:

$$H(z) = \frac{1}{64}\left[\frac{1-z^{-8}}{1-z^{-1}}\right]^2 \quad (8)$$

and the corresponding frequency response is:

$$H_D(f/f_0) = \left|\frac{\text{sinc}(8\,f/f_0)}{\text{sinc}(f/f_0)}\right|^2. \quad (9)$$

When the decimator is cascaded with a modulator having a transfer function:

$$H_m(f/f_0) = |\text{sinc}(f/f_0)|, \quad (10)$$

the overall transfer function becomes:

$$H_m(f/f_0)\cdot H_D(f/f_0) = \left|\frac{\text{sinc}^2(8\,f/f_0)}{\text{sinc}(f/f_0)}\right|. \quad (11)$$

At 28 and 36 KHZ resampling, equation (11) yields an overall response of −34.1 and −38.3 dB, respectively, assuring adequate protection against aliasing.

Figure 7:
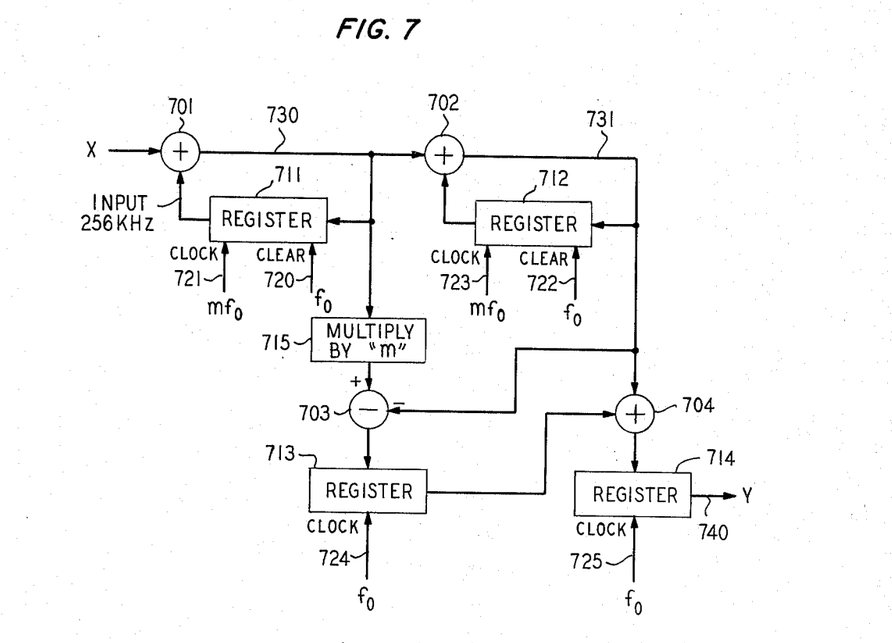
FIG. 7 is a block diagram of a digital-to-digital converter or decimator constructed in accordance with the principles of the present invention.

For input samples of frequency $mf_0$ and a desired output frequency of $f_0$, a block diagram of a decimator arranged to accumulate 2m input samples using overlapped, triangular weighting in accordance with the present invention is shown in FIG. 7. The circuit of FIG. 7 preferably uses parallel arithmetic and comprises four adders 701 through 704, four registers 711 through 714, each holding one sample word, and a multiply-by-m circuit 715 that can simply be a shift circuit when m is a power of 2 (e.g., a 3-bit shift for m=8). Adder 701 together with register 711 and adder 702 with register 712 each perform an accumulate and dump function. The registers 711 and 712 are clocked at $mf_0$ and cleared at $f_0$ KHZ, under control of a clock source, not shown. Registers 713 and 714 are clocked at $f_0$ KHZ at the same time registers 711 and 712 are cleared. Register 713 provides a delay equal to the interval $1/f_0$ between output pulses, and register 714 simply acts as an output holding register.

The operation of the decimator of FIG. 7 is easily understood from the expressions for signals at the points A, B, C and D in FIG. 7 at the time the $f_0$ clock is applied. Namely, $$A_i = \sum_{K=mi}^{K=m(i+1)-1} X_K \quad (12)$$

$$B_i = \sum_{K=mi}^{m(i+1)-1} [m(i+1)-K]X_K \quad (13)$$

$$C_i = mA_i - B_i = \sum_{K=mi}^{m(i+1)-1} (K-mi)X_K \quad (14)$$

and $$D_i = C_i + B_{i+1} \quad (15)$$
$$= \sum_{K=mi}^{m(i+1)-1} (K-mi)X_K + \sum_{K=m(i+1)}^{m(i+2)-1} (m(i+2)-K)X_K.$$

$D_i$ is the desired output, as seen from equation (7).

Figure 8:
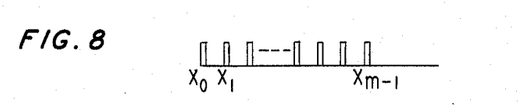
FIGS. 8-12 graphically illustrate weighted sums computed by various functional portions of the decimator of FIG. 7.

The operation of the decimator of FIG. 7 can be further understood by considering the operation of its functional parts in connection with the diagrams of FIGS. 8 through 12. Adder 701 together with register 711 constitute an "unweighted" accumulator. The register is cleared at the beginning of each m-sample interval by a pulse on line 720 at frequency $f_0$. Each time a clock pulse at frequency $mf_0$ is applied on line 721, an input sample is added to the present contents of register 711 and the sum read into and stored in the register. This procedure is repeated for each of the m input samples occurring between each output sample. All of the sample values are treated equally, essentially being multiplied by a unity weight factor, as illustrated in FIG. 8.

Figure 9:
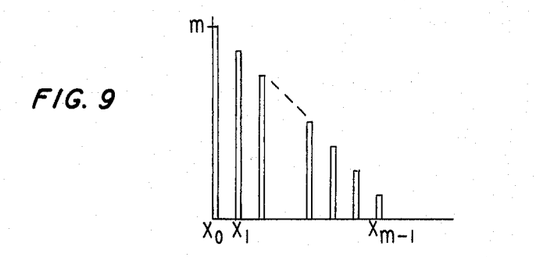

By applying the output of the first accumulator (on line 730) to a second accumulator (consisting of adder 702 and register 712), the accumulation performed on the input samples becomes non-uniformly weighted. Register 712 is cleared at the beginning of each m-sample interval by a pulse on line 722 at frequency $f_0$. Each time a clock pulse at frequency $mf_0$ is applied on line 723, the contents of register 712 are added to the output of the first accumulator, and the results read into and stored in the register. The accumulation is repeated m times, at the occurrence of each input sample. Thus, the first sample in each interval receives m times the weight of the last sample in the interval, and intermediate samples are uniformly distributed or proportionately weighted. The weighting progression of the sample in each interval, from $m, m-1, m-2\ldots 1$, is illustrated in FIG. 9.

Figure 10:
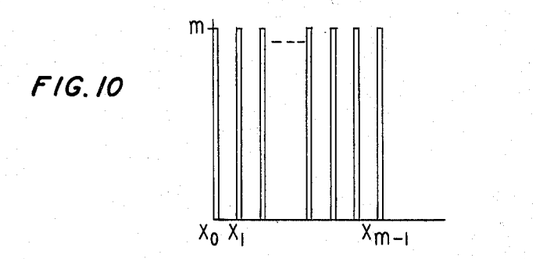

The magnitude of the output from the first accumulator (taken from adder 701 on line 730) is increased "m" times by multiplier circuit 715. This may be accomplished by a simple shift of the multibit value on line 730 when m is a power of 2. The output from multiplier circuit 715, shown in FIG. 10, is similar to that shown in FIG. 8, but "m" times greater.

Figure 11:
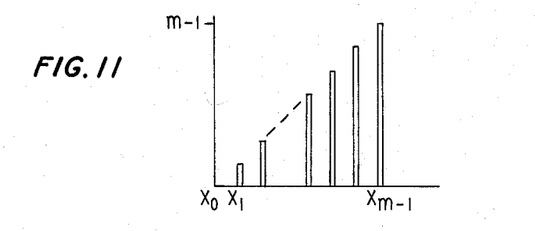

The output of the second accumulator (taken from adder 702 on line 731) is subtracted from the output of multiplier circuit 715, using subtractor 703. The result, shown in FIG. 11, is nonlinear accumulation, wherein the final sample has $m-1$ times the weight of the second sample, and intermediate samples are proportional, running from $1, 2, 3\ldots m-1$. The first sample in the interval has zero weight.

Figure 12:
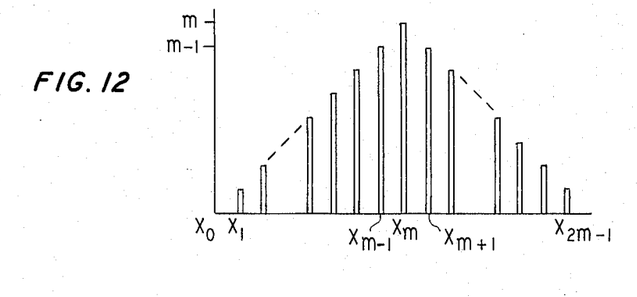

The output of subtractor 503 is held or delayed for the time interval $1/f_0$ between successive output samples by register 513 which receives clock pulses on line 724 at the rate $f_0$. This delay has the effect of "freezing" the subtractor output (FIG. 11) such that when the output of register 713 is combined in adder 705 with the output from the second accumulator on line 731 the former includes m samples in the first interval and the latter includes m samples in the next interval. As shown in FIG. 12, the overall accumulation is triangularly weighted, samples at the beginning and end of the accumulation period receiving least weight and samples near the middle of the period receiving most weight. the samples lying between the extremes are uniformly distributed or proportionately weighted, as is desired.

The output of adder 704 may be used directly or held between each output sample in register 514, which receives clock pulses on line 725 at the output rate $f_0$. The output from the decimator on line 740 may also be scaled down, if desired, to normalize the output with respect to the input level. Advantageously, if the value of m is a power of 2, the sum of the weighting coefficients will likewise be a power of 2, and a simple shift may be used to accomplish the scale change. For example, if m=8, the coefficients are:

$A_0 = 0$      $A_4 = A_{12} = 4$
$A_1 = A_{15} = 1$      $A_5 = A_{11} = 5$
$A_2 = A_{14} = 2$      $A_6 = A_{10} = 6$
$A_3 = A_{13} = 3$      $A_7 = A_9 = 7$
     $A_8 = 8$ The sum of the coefficients is 64, and a shift of 5-bit positions will normalize the output of the accumulator with respect to the input.

Various modifications and adaptations of the present invention may be made by those skilled in the art, and for this reason it is intended that the invention be limited only by the appended claims.

We claim:

1. Apparatus for converting a series of input samples at a frequency $mf_0$ to a series of output samples at rate $f_0$, the value of each of said output samples being a weighted sum of 2m of said input samples occurring in an accumulation period prior to said each output sample, comprising:
   first and second linear accumulators connected in cascade arrangement, the output of said first accumulator representing the unweighted sum of m particular ones of said input samples, and the output of said second accumulator representing a uniformly distributed weighted sum of said m particular input samples, wherein the weight of the first of said m samples is m times greater than the weight of the last of said samples,
   means for multiplying said first accumulator output by a scaling factor m,
   means for forming the difference between the output of said multiplying means and said output of said second accumulator,
   means for delaying the output of said difference forming means until the next m input samples are accumulated, and
   means for adding the output of said delaying means to said output of said second accumulator to form one of said output samples.

2. The invention defined in claim 1 wherein said first and second accumulators each comprise:
   an adder circuit having a first input for receiving said input samples and a second input, and
   means for periodically applying the output of said adder to said second input and for accumulating the subsequent output of said adder circuit.

3. Apparatus for converting a series of multibit input samples occurring at a first frequency $f_1$ to a corresponding series of multibit output samples at a second frequency $f_2$, where $mf_2=f_1$, each of said output samples being a function of the weighted sum of 2m input samples in an accumulation interval, including:
   a first accumulator for combining groups of m input samples by repeatedly adding each sample to a sum of previous samples,
   a second accumulator for repeatedly adding each of said sums output from said first accumulator to previously accumulated sums, whereby the output of said second accumulator represents a weighted sum of said m input samples, the first sample of said group having a weight m times greater than the weight of the last sample,
   means for subtracting the output of said second accumulator from a version of the output of said first accumulator which has been multiplied m times,
   means for delaying the output of said subtracting means until the succeeding m input samples are accumulated, and
   means for adding the output from said second accumulator to the output from said delaying means after the occurrence of said succeeding m samples.

4. The invention defined in claim 2 wherein each of said first and second accumulators includes:
   an adder for receiving input samples, and
   a register for periodically accumulating the output from said adder and for supplying said accumulated output to said adder for recombination with said input samples.

5. Apparatus for converting a series of input samples $X_0, X_1, X_2 \ldots$ occurring at a rate $mf_0$ to a series of output samples $Y_i (i=0, 1, 2 \ldots)$ occurring at a rate $f_0$, each of said output samples being functionally related to a weighted sum of 2m previous input samples such that:

$$Y_i = \sum_{K=mi}^{K=mi+m-1} (K - mi)X_K + \sum_{K=m(i+1)}^{mi+2m-1} (m(i + 2) - K)X_K,$$

where $i=0, 1, 2 \ldots$, comprising
(a) first means for accumulating a running sum $$A_i = \sum_{K=mi}^{K=m(i+1)-1} X_K$$

of m of said input samples by adding the value of each sample in a group of m samples to the previous sum of said sample values,
(b) second means for accumulating a linearly distributed weighted sum $$B_i = \sum_{K=mi}^{m(i+1)-1} [m(i + 1) - K]X_K$$

of said m input samples in said group, the first sample having a weight m times greater than the last sample in said group, by adding the output of said accumulating means to the previous sum of said outputs each time said previous sum is incremented,
means for multiplying the output $A_i$ of said first means by the factor m,
means for forming the difference $$C_i = mA_i - B_i = \sum_{K=mi}^{m(i+1)-1} (K - mi)X_K$$

between the output of said multiplying means and the output from said second means,
means for delaying the output of said forming means until the next group of m input samples are accumulated in said second means, and
means for combining the outputs of said delaying means and said second means.

6. A digital-to-digital converter for accumulating, at the rate $f_0$, the weighted sums of groups of input samples occurring at the rate $mf_0$, each of said groups comprising 2m of said samples $X_0, X_1, X_2 \ldots X_{2m-1}$, said samples being respectively weighted by factors $A_0, A_1, A_2 \ldots A_{2m-1}$, where:

$$A_0 = 0$$
$$A_1 = A_{2m-1} = 1$$
$$A_2 = A_{2m-2} = 2$$
$$A_3 = A_{2m-3} = 3$$
$$\vdots$$
$$A_m = m$$

said converter comprising:
first means for forming the weighted sum of subgroups of m of said samples, wherein the last sample in said subgroup receives (m-1) times the weight of the first sample in said subgroup and wherein intermediate samples are proportionately weighted,
second means for forming the weighted sum of subgroups of m of said samples, wherein the first sample in said subgroup receives m times the weight of the last sample in said subgroups and wherein intermediate samples are proportionately weighted,
means for delaying the output of said first means for a time interval needed to process a subsequent subgroup of said samples, and
means for combining the output of said second means with the output of said delay means.

7. The invention defined in claim 6 wherein said first means includes:
first and second registers,
third means for adding, at the rate $mf_0$, the contents of said first register to each input sample and storing the sum in said first register,
fourth means for adding, at the rate $mf_0$, the contents of said second register to each sum output from said third means and for storing the sum in said second register,
means for multiplying the output of said third means by the factor "m" upon the accumulation of each subgroup, and
means for subtracting the sum stored in said second register from the output of said multiplying means.

* * * * *

UNITED STATES PATENT AND TRADEMARK OFFICE
CERTIFICATE OF CORRECTION

PATENT NO. : 4,281,318

DATED : July 28, 1981

INVENTOR(S) : James C. Candy and Bruce A. Wooley

It is certified that error appears in the above-identified patent and that said Letters Patent are hereby corrected as shown below:

Column 1, line 46, "$X_2$" should read --$2X_2$--.

Column 2, line 25, "sECMjd" should read --second--; line 28, "impleDEnted" should read --implemented--.

*Signed and Sealed this*

*Nineteenth* Day of *January 1982*

[SEAL]

*Attest:*

*Attesting Officer*

GERALD J. MOSSINGHOFF

*Commissioner of Patents and Trademarks*